United States Patent [19]

Tanaka et al.

[11] Patent Number: 4,626,795
[45] Date of Patent: Dec. 2, 1986

[54] DIFFERENTIAL AMPLIFIER

[75] Inventors: Tatsuo Tanaka; Nana Shigematsu; Kazushige Koshika, all of Yokohama, Japan

[73] Assignees: Kabushiki Kaisha Toshiba, Kawasaki; Tosbac Computer System Co., Ltd., Tokyo, both of Japan

[21] Appl. No.: 773,188

[22] Filed: Sep. 6, 1985

[30] Foreign Application Priority Data

Sep. 11, 1984 [JP] Japan .................................. 59-190012

[51] Int. Cl.$^4$ ............................................. H03F 3/45
[52] U.S. Cl. ..................................... 330/257; 330/288
[58] Field of Search ............... 330/257, 288; 323/315, 323/316

[56] References Cited

U.S. PATENT DOCUMENTS

4,558,287 12/1985 Tanaka ................................. 330/257

Primary Examiner—James B. Mullins
Attorney, Agent, or Firm—Finnegan, Henderson, Farabow, Garrett & Dunner

[57] ABSTRACT

First and second current mirror circuits are provided to the first and second amplifying transistors, respectively. The output current paths of current mirror circuits constitute output current terminals, respectively, and the reference input current paths are connected to the collectors of the first and second transistors, respectively. The first current mirror circuit comprises third and fourth transistors and the second current mirror circuit comprises fifth and sixth transistors. The base of the third transistor of the first current mirror circuit and the base of the fifth transistor of the second current mirror circuit are connected to first and second reference potentials, respectively. The base of the fourth transistor of the first circuit and the base of the sixth transistor of the second circuit are connected to the collectors of the first and second transistors, respectively.

4 Claims, 10 Drawing Figures

DIFFERENTIAL AMPLIFIER

BACKGROUND OF THE INVENTION

The present invention relates to a differential amplifier and, more particularly, to a differential amplifier having a current mirror circuit as a load for a pair of transistors which constitute a differential amplifying circuit.

Figure 1:
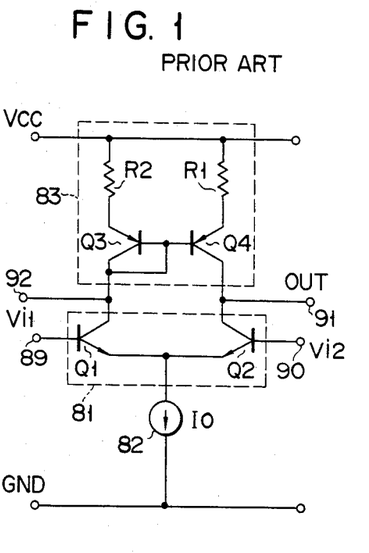
FIGS. 1 to 3 are circuit diagrams of conventional differential amplifiers.
Figure 2:
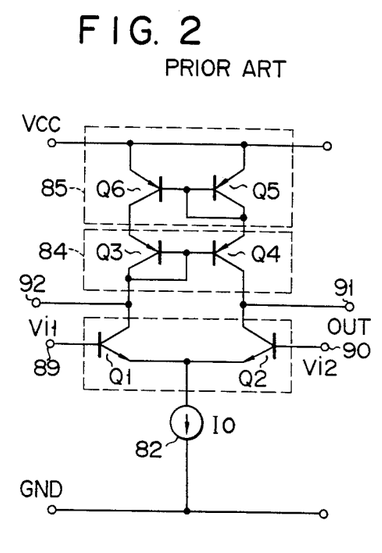
Figure 3:
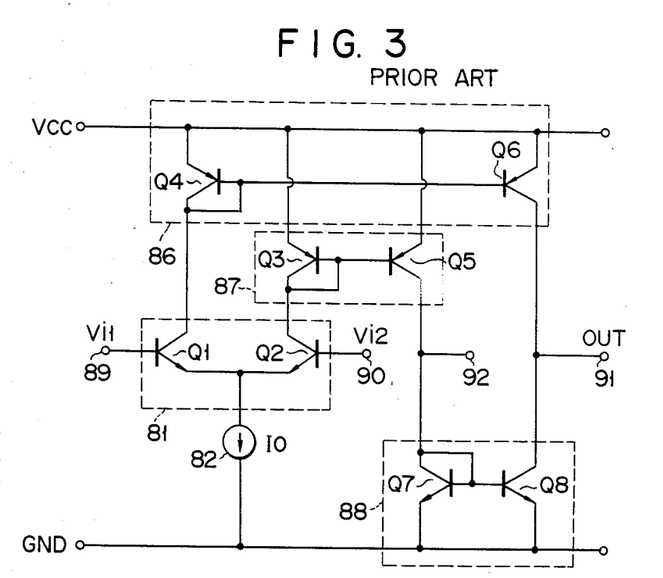

FIGS. 1, 2 and 3 show conventional differential amplifiers having current mirror circuits as loads. Referring to FIGS. 1 to 3, reference numerals Q1 and Q2 denote npn transistors; Q3 to Q6, pnp transistors; R1 and R2, resistors; 81, a differential amplifying circuit; 82, a constant current source; 83 to 88, current mirror circuits; Vcc, a high power source potential; GND, a low power source potential (generally a ground potential); 89, a non-inverting input terminal; 90, an inverting input terminal; and 91 and 92, output terminals.

Referring to FIG. 1, assume that an input current (a reference current) flowing through the current mirror circuit 83 and an output current therefrom are equal. In this case, when an input signal voltage Vi2 at the terminal 90 is higher than an input signal voltage Vi1 at the terminal 89, a current flows from the terminal 91 as part of the collector current to the collector of the transistor Q1. Then, the collector current of the transistor Q2 becomes higher than that of the transistor Q1. Conversely, when the voltage Vi1 is higher than the voltage Vi2, a current flows from an output current path of the circuit 83 to the terminal 91, so that the collector current of the transistor Q2 becomes smaller than that of the transistor Q1. This operation also applies to the circuit shown in FIG. 2 if a current mirror circuit 84 replaces the circuit 83.

Referring to FIG. 3, when Vi1>Vi2, a signal current of the collector of the transistor Q1 becomes higher than that of the collector of the transistor Q2. Then, due to the operation of the circuits 86 and 87, a signal current of the collector of the transistor Q6 becomes higher than that of the collector of the transistor Q5. The signal of the collector of the transistor Q5 serves as a reference current of the circuit 88. Therefore, the signal current of the collector of a transistor Q8 becomes equal to that of the collector of the transistor Q5. As a result, a signal current of the collector of the transistor Q6 becomes higher than that of the transistor Q8, so that a current corresponding to a difference therebetween flows through the terminal 91.

When Vi1<Vi2, the signal current of the collector of the transistor Q1 becomes higher than that of the collector of the transistor Q2. Then, due to the operation of the circuits 86 and 87, the signal current of the collector of the transistor Q6 serves as the signal current of the transistor Q5. The signal current of the collector of the transistor Q5 then serves as a reference current of the circuit 88. Therefore, the signal current of the collector of the transistor Q8 becomes equal to that of the collector of the transistor Q5. Then, the signal current of the collector of the transistor Q6 becomes lower than that of the collector of the transistor Q8, and a current corresponding to the difference therebetween flows into the amplifier from the terminal 91.

In the amplifier of FIG. 1, the voltage drop across the current mirror circuit is represented by $$V_F + R2 \times I_o/2$$

where $V_F$ is the forward voltage drop of the diode-connected transistor Q3, Io is the current of the source 82, and R2 is the resistance of the resistor R2. Note that a resistor and its resistance are denoted by the same reference symbols in the following description for the purpose of easy understanding.

The voltage drop can be reduced to a minimum by properly selecting the resistance R2 and the current Io. Then, the amplifier can be operated by a low voltage source.

However, when a current amplification factor $\beta$ of the transistors Q3 and Q4 of the circuit 83 is small, their base currents cannot be neglected. A current conversion efficiency (current mirror characteristic) of the circuit 83 is degraded and the output current offset at the terminal 91 becomes large. In addition, when the collector-emitter voltage of the transistor Q4 is varied due to variation in the voltage Vcc, the collector current of the transistor Q4 is varied due to its Early effect. In order to prevent this, if the voltage of the power source to be used varies widely, the Early effect must be considered in designing an amplifier. In the amplifier shown in FIG. 1, the resistors R1 and R2 are inserted in order to reduce the Early effect. However, the output current offset is not lowered by the resistors R1 and R2 to an extent that it is negligible.

In the amplifier of FIG. 2, the base current of the transistors Q5 and Q6 of the current mirror circuit 85 flows into the collector of the transistor Q2, while the base current of the transistors Q3 and Q4 of the circuit 84 flows into the collector of the transistor Q1. Thus, the base current corresponding to the circuit 84 is corrected. Therefore, the current-mirror characteristic of the circuit 84 is considerably improved, and the output current offset is decreased. However, offsetting of a certain degree still occurs. Furthermore, since the circuits 84 and 85 are connected in series to each other, the total voltage drop thereacross becomes $2V_F$. $V_F$ is the forward bias voltage of a diode-connected transistor. Therefore, the amplifier shown in FIG. 2 cannot be applied to a circuit requiring a minimum operating power source voltage Vccmin of about 0.9 V.

In the circuit shown in FIG. 3, when the current amplification factor $\beta$ of the pnp transistors Q3 to Q6 constituting the circuits 86 and 87 is small, the base currents of the transistors Q3 to Q6 cannot be neglected. In this case, current mirror characteristics of the circuits 86 and 87 are unsatisfactory and the transistors Q5 and Q6 have different collector-base voltages $V_{CE}$. In designing the amplifier, the difference in voltage $V_{CE}$ must be considered. Furthermore, the collector potential of the transistors Q1 and Q2, is suppressed to $Vcc - V_F$ (where $V_F$ is the forward bias voltage of the diode-connected transistors Q4 and Q3). As a result, in order to apply the amplifier of FIG. 3 to a circuit requiring a minimum operation power source voltage Vccmin of about 0.9 V, collector-emitter saturated voltages $V_{CESAT}$ of the transistors Q1 and Q2 must be small. Since the collector potentials of the transistors Q1 and Q2 are both $Vcc - V_F$, the collector and collector-emitter potentials of the transistors Q1 and Q2 vary when Vcc varies. In this case, the collector currents of the respective transistors Q1 and Q2 vary due to the Early effect, resulting in variation in the output offset. As a result, the amplifier of FIG. 3 is not suitable for a circuit requiring a low voltage operation and a power source of a wide voltage range.

The features of the circuits shown in FIGS. 1, 2 and 3 are summarized with respect to items as follows:

| Item | FIG. 1 | FIG. 2 | FIG. 3 |
|---|---|---|---|
| Output Offset | Large | Small | Large |
| Operation at Power Source Voltage Vccmin = 0.9 V | Possible | Impossible | Impossible; or required to use a transistor having small $V_{CESAT}$ |
| Operation within Wide Range of Power Source Voltage (Vcc) | Impossible | Impossible | Impossible |

SUMMARY OF THE INVENTION

The present invention has been made in view of the above inventioned circumstances and has as its object to provide a differential amplifier, wherein the minimum operation power source voltage is about 0.9 V, an output current is constant even if the voltage range of the power source is wide, the characteristic of a current mirror circuit as a load for an amplifying circuit is favorable, and output current offset is small.

According to the invention, there is provided a differential amplifier comprising:
  a pair of first and second input terminals receiving a pair of signal voltages to be amplified, respectively;
  a first amplifying circuit comprising first and second transistors of a first conductivity type, the bases of which are connected to said first and second input terminals respectively;
  a second amplifying circuit comprising third and fourth transistors of said first conductivity type, said third transistor being at the non-inverting input side of said second amplifying circuit and said fourth transistor being at the inverting input said of said second amplifying circuit, the base of said fourth transistor being connected to the collector of said first transistor in said first amplifying circuit, and the base of said third transistor being connected to a first bias potentail;
  a first current mirror circuit comprising fifth and sixth transistors of a second conductivity type, the collector of said fifth transistor being connected to the base of said fourth transistor and the collector of said first transistor, and a collector current of said sixth transistor being taken out through a first output terminal as a first output current;
  a third amplifying circuit comprising seventh and eighth transistors of said first conductivity type, said seventh transistor being at the non-inverting input side of said third amplifying circuit and said eighth transistor being at the inverting input side of said third amplifying circuit, the base of said eighth transistor being connected to the collector of said second transistor in said first amplifying circuit, and the base of said seventh transistor being connected to a second bias potential; and
  a second current mirror circuit comprising ninth and tenth transistors of said second conductivity type, the collector of said ninth transistor being connected to the base of said eighth transistor and the collector of said first transistor, and a collector current of said tenth transistor being taken out through a second output terminal as a second output current.

DETAILED DESCRIPTION OF THE PREFERRED EMBODIMENTS

Embodiments of the present invention will now be described with reference to the accompanying drawings.

Figure 4:
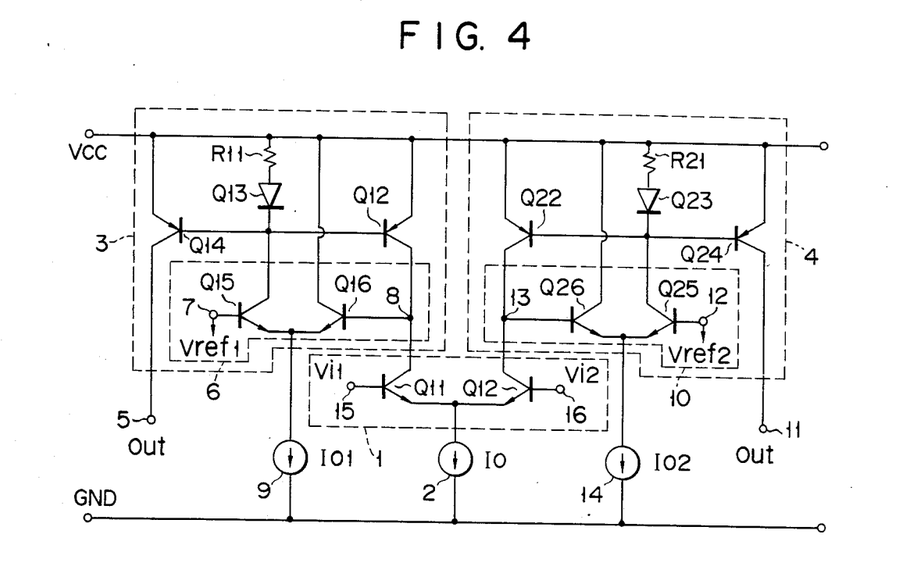
FIG. 4 is a circuit diagram of a differential amplifier according to an embodiment of the present invention.

Referring to FIG. 4, a pair of transistors Q11 and Q21 of npn conductivity type for differential amplification constitute a first differential amplifying circuit 1. The emitters of the transistors Q11 and Q21 are connected to each other. A constant current source 2 is inserted between a junction of the emitters of the transistors Q11 and Q21 and ground potential GND. According to the invention, there is provided a reference potential. A first current mirror circuit 3 is inserted between the transistor Q11 and a Vcc power source. A second current mirror circuit 4 is inserted between the transistor Q21 and the Vcc power source. The circuit 3 has a diode-connected transistor Q13 at an input current side, i.e., at the reference current side, two transistors Q12 and Q14 with pnp conductivity at the output side, and a resistor R11. The emitters of the transistors Q12 and Q14 are both connected to the Vcc power source. The collector of the transistor Q12 is connected to that of the transistor Q11. The collector of the transistor Q14 is connected to a first output terminal (Out1) 5. The pair of transistors Q15 and Q16 for differential amplification constitute a second differential amplifying circuit 6. The base of the transistor Q15 is connected to a non-inverting input terminal 7 to which a first reference voltage Vref1 is applied. The collector of the transistor Q15 is connected to the output terminal of the transistor Q13 at the reference input side of the circuit 3. The collector of the transistor Q16 is connected to the Vcc power source, and the base thereof constitutes an inverting input terminal 8 and is connected to the collector of the output-side transistor Q12. The emitters of the transistors Q15 and Q16 are connected to ground potential GND through a constant current source 9.

The circuit 4 has substantially the same configuration as that of the circuit 3. More particularly, the circuit 4 has a diode-connected transistor Q23 at the input current side, i.e., at the reference current side, two output current side pnp transistors Q22 and Q24 having polarities opposite to those of transistors Q25 and Q26 for differential amplification, and a resistor R21. The emitters of the transistors Q22 and Q24 are both connected to the Vcc power source. The collector of the transistor Q22 is connected to that of the transistor Q21. The collector of the transistor Q24 is connected to a second output terminal (Out2) 11. The pair of transistors Q25 and Q26 for differential amplification constitute a third differential amplifying circuit 10. The base of the transistor Q25 is connected to a non-inverting input terminal 12 to which a second reference voltage Vref2 is applied. The collector of the transistor Q25 is connected to the output terminal of the transistor Q23 at the reference input side of the circuit 4. The collector of the transistor Q26 is connected to the Vcc power source, and the base thereof constitutes an inverting input terminal 13 and is connected to the collector of the transistor Q22 at the output side. The emitters of the transistors Q25 and Q26 are both connected to ground potential GND through a constant current source 14 through which a constant current I02 flows.

In the differential amplifier of FIG. 4, input signal voltages Vi1 and Vi2 are supplied to signal input terminals 15 and 16, respectively. The voltages Vi1 and Vi2 are differentially amplified by the circuit 1.

The first and second current mirror circuits 3 and 4 constituting loads of the first differential amplifying circuit 1 operate complementarily. Therefore, operation of the circuit 3 will be described hereinafter and that of the circuit 4 will be omitted.

The second differential amplifying circuit 6 connected to the current mirror circuit 3 is subjected to a negative feedback by the transistor Q12, thereby constituting a voltage follower circuit. The potential at the terminal 8 of the circuit 6 is set to be the same as that at the terminal 7 to which the potential Vref1 is applied. For example, when the base potential of the transistor Q16 is decreased and the collector current is thus decreased, the collector current of the transistor Q15 is increased by an amount equal to the decrease in the collector current of the transistor Q16. The base currents of the transistors Q12, Q13 and Q14 are increased to compensate for the increase in the collector current of the transistor Q15. Then, the collector current of the transistor Q12 is increased, and the base potential of the transistor Q16 is thus raised. In this manner, the circuit 6 is subjected to a negative feedback by the transistor Q12.

In the differential amplifier of FIG. 4, the base currents of the transistors Q12, Q13 and Q14 are supplied as part of the collector current to the collector of the transistor Q15 in order to correct the base current of the circuit 3, thereby providing satisfactory current-mirror characteristics. The reference potential Vref1 is applied to the base of the transistor Q15 so that the collector potential of the transistor Q11 is suppressed to the reference potential Vref1. Therefore, even if the Vcc power source potential varies, the collector-emitter voltage $V_{CE}$ of the transistor Q11 is constant as far as the reference potential Vref1 is constant. Then, the collector current of the transistor Q11 does not vary, and the output current from the output terminal 5, which is a collector current of the transistor Q14, does not vary. Even if the Vcc power source potential varies over a wide range, the variation in the output current is suppressed, thereby minimizing the output offset. Transistors having a high current amplification factor $\beta$ can generally be used as the transistors Q15 and Q16 for differential amplification. For this reason, the influence of the base currents of the transistors Q15 and Q16 can be neglected. Furthermore, the difference between the collector potential of the transistor Q11 and the potential of the Vcc power source is only the collector-emitter voltage $V_{CE}$ of the load transistor Q12. Therefore, a low voltage power source can be used. For example, assuming that the reference voltage Vref1=0.7 V and the saturated voltage $V_{CESAT}$ of the collector-emitter voltage VCE is 0.2 V, the power source voltage Vcc is 0.9 V. This indicates that the differential amplifier of FIG. 4 is applicable to a low voltage power source circuit having a minimum operation voltage of 0.9 V.

Figure 5:
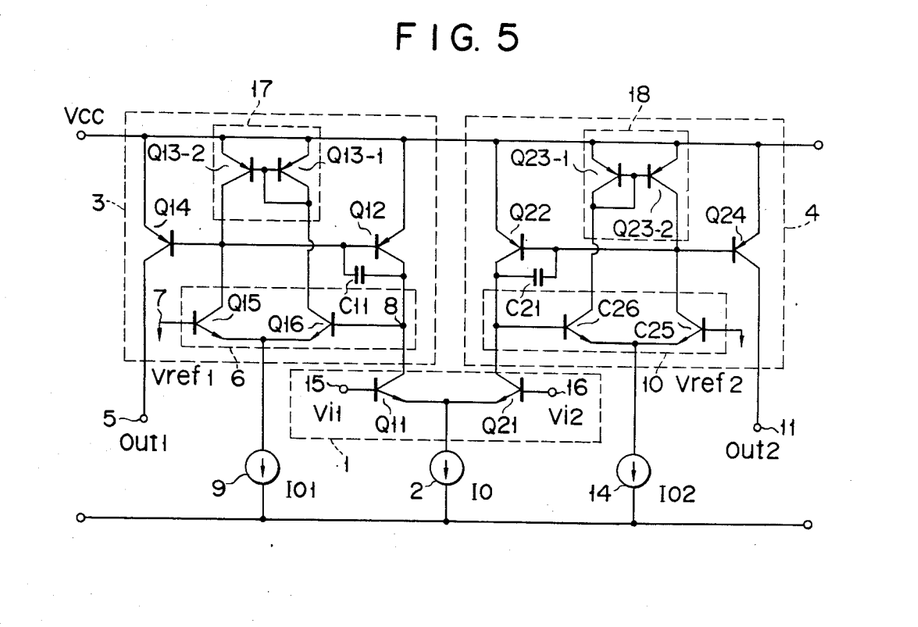
FIGS. 5 and 6 are circuit diagrams of differential amplifiers according to other embodiments of the present invention.

FIG. 5 shows a differential amplifier according to a second embodiment of the present invention. The embodiment of FIG. 5 has the following differences from that of FIG. 4. First, the resistor R11 and the diode-connected transistor Q13 in FIG. 4 are eliminated. An output side transistor Q13-2 and a reference input side transistor Q13-1 which constitute a current mirror circuit 17 are provided to correspond to the collectors of a pair of npn transistors Q15 and Q16 for differential amplification which constitute a second differential amplifying circuit 1. The resistor 21 and the diode-connected transistor Q23 in FIG. 4 are eliminated. An input side transistor Q23-2 and a reference input side transistor Q23-1 which constitute a current mirror circuit 18 are provided to correspond to the collectors of a pair of npn transistors Q25 and Q26 for differential amplification which constitute a third differential amplifying circuit 10. Since others of the embodiment of FIG. 5 are substantially the same as those of FIG. 4, the same reference numerals as in FIG. 4 are employed to denote the same parts in FIG. 5, and a description thereof is omitted.

Capacitors C11 and C21 for oscillation prevention are provided in the collector-base paths of transistors Q12 and Q22. However, this does not substantially distinguish the embodiment of FIG. 5 from that of FIG. 4 and the capacitors C11 and C21 can also be provided in the embodiment of FIG. 4.

The operation of the differential amplifier of the embodiment of FIG. 5 is substantially the same as that of FIG. 4. More particularly, for example, when the base potential of the transistor Q16 is lowered and its collector current is thus decreased, the collector current of the transistor Q15 is increased by an amount corresponding to the decrease in the collector current of the transistor Q16. However, due to the presence of the circuit 17, the collector current of the transistor Q16 becomes equal to that of the transistor Q13-2. Then, the base currents of the transistors Q12 and Q14 are increased by amounts corresponding to a difference between the collector currents of the transistors Q15 and Q13-2, the collector current of the transistor Q12 is increased, and the collector-emitter potentials $V_{CE}$ of the transistors Q12 and Q14 are decreased. Therefore, the base of the transistor Q16 is subjected to a negative feedback so that the base potential of the transistor Q16 is increased. The base currents of the transistors Q14 and Q12 are supplied as part of the collector current to the collector of the transistor Q15, and the base currents of the transistors Q13-1 and Q13-2 are supplied as part of the collector current to the collector of the transistor Q16. The base current of the circuit 17 is thus corrected. As a result, the current-mirror characteristics of the circuit 17 become good and no output current offset occurs.

When the base potential of the transistor Q26 is decreased and its collector current is thus decreased, the collector current of the transistor Q25 is increased by an amount corresponding to the decrease in the collector current of the transistor Q26. However, due to the presence of the circuit 18, the collector current of the transistor Q26 becomes equal to that of the transistor Q23-2. Then, the base currents of the transistors Q22 and Q24 are increased by amounts corresponding to the difference between the collector currents of the transistors Q25 and Q23-2, the collector current of the transistor Q22 is increased, and the collector-emitter potentials $V_{CE}$ of the transistors Q22 and Q24 are decreased. As a result, the base of the transistor Q26 is subjected to a negative feedback so that the base potential of the transistor Q26 becomes high. The base currents of the transistors Q24 and Q22 are supplied as part of the collector current to the collector of the transistor Q25, and the base currents of the transistors Q23-1 and Q23-2 are supplied as part of the collector current to the collector of the transistor Q26. The base current of the circuit 18 is thus corrected. Therefore, the current-mirror characteristics of the circuit 18 become good, and no offset occurs in the output current.

The reference potential Vref1 is supplied to the base of the transistor Q15 of the amplifier of the second embodiment of FIG. 5 in a similar manner as in the amplifier of the first embodiment of FIG. 4. The collector current of a transistor Q11 is suppressed to the reference potential Vref1. Then, even if the Vcc potential varies, the collector-emitter potential $V_{CE}$ of the transistor Q11 is constant as far as the reference potential Vref1 is constant. As a result, the collector current of the transistor Q11 as a reference does not vary, and the output current from a terminal 5 which is the collector current of the transistor Q14 does not vary. Similarly, a reference potential Vref2 is applied to the base of the transistor Q25. Then, the collector potential of the transistor Q21 is suppressed to the reference potential Vref2. As a result, even if the Vcc potential varies, the collector-emitter potential $V_{CE}$ is constant as far as the reference potential Vref2 does not vary. Therefore, the collector current of the transistor Q21 as a reference does not vary, and the output current from the terminal 11 which is the collector current of the transistor Q24 does not vary. An output current which is not offset can be thus obtained even if the Vcc potential varies in a wide range. The amplifier of FIG. 5 is applicable to a low voltage power source circuit.

Figure 6:
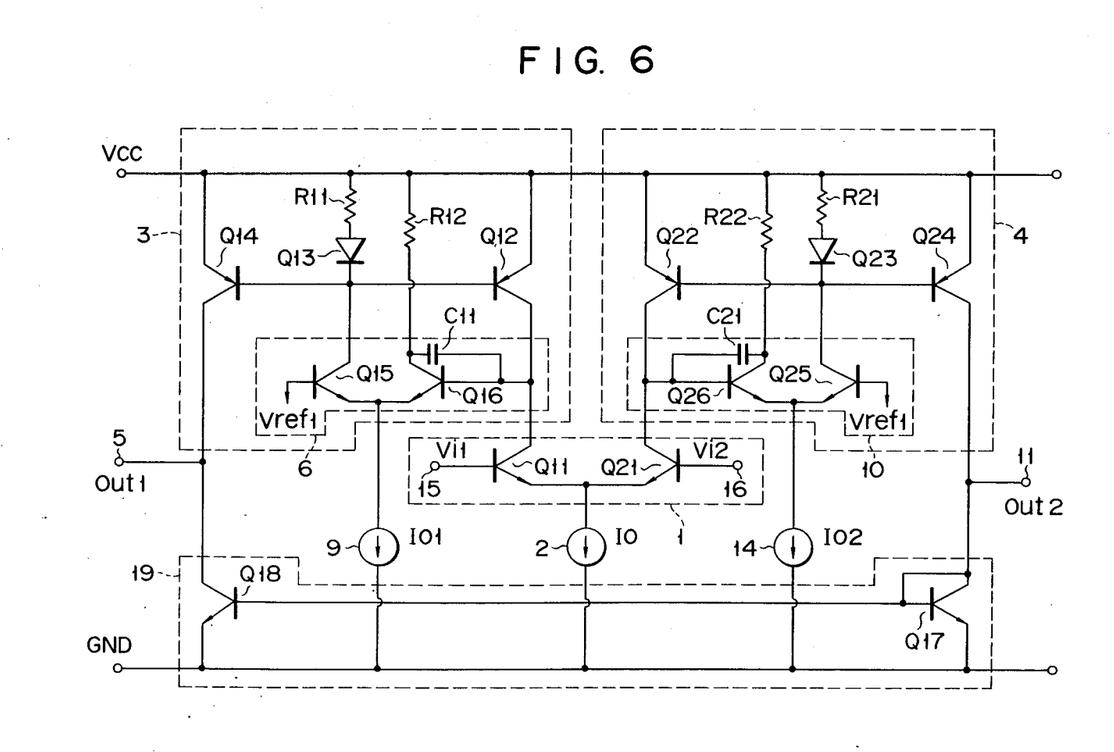

FIG. 6 shows a differential amplifier according to the third embodiment of the present invention. The amplifier of FIG. 6 is different from that of FIG. 4 in that a third current mirror circuit 19, resistors R12 and R22, and capacitors C11 and C21 for oscillation prevention are provided. A reference input side transistor Q17 is inserted between a first output terminal 11 and ground potential GND. An output side transistor Q18 of the circuit 19 is inserted between a second output terminal 5 and ground potential GND. The resistor R12 is inserted between the collector of a transistor Q16 and the Vcc potential. The resistor R22 is inserted between the collector of a transistor Q26 and the Vcc potential. The capacitor C11 is connected in the base-collector path of the transistor Q16. The capacitor C21 is connected in the base-collector path of the transistor Q26. Other parts of the amplifier of FIG. 6 are substantially the same as those of FIG. 4, the same reference numerals as in FIG. 4 are used to denote the same parts in FIG. 5, and a description thereof is omitted.

In the differential amplifier of the third embodiment, when an input signal voltage Vi2 at an inverting input terminal 16 becomes higher than an input signal potential Vi1 at a non-inverting input terminal 15, a current flows out from the output terminal 5. Conversely, when Vi2<Vi1, the collector current of a transistor Q11 becomes large and a current flows into the amplifier from the terminal 5.

In the third embodiment, the output current offset due to variation in the Vcc potential can be prevented. If the potential of the terminal 5 is set to about Vref1 (e.g., 0.7 V), the differential amplifier can be operated by a low voltage power source.

Figure 7:
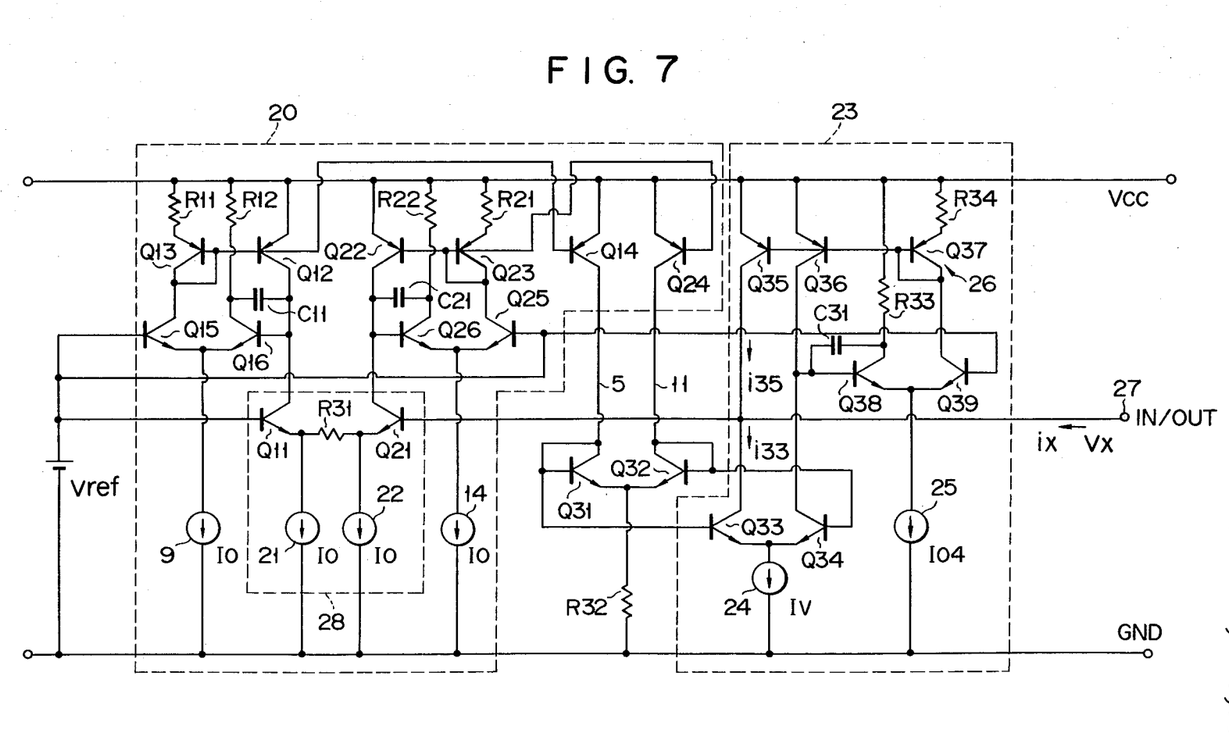
FIG. 7 is a circuit diagram of a variable resistor circuit according to an application example of the present invention.

FIG. 7 shows a variable resistor circuit 40 incorporating differential amplifiers according to the present invention. A first differential amplifier 20 according to the present invention in the variable resistor circuit 40 has the following differences from the differential amplifier of FIG. 4. First, a resistor R31 is inserted between the emitters of transistors Q11 and Q21. The emitters of transistors Q11 and Q21 are connected to ground potential GND through constant current sources 21 and 22. A capacitor C11 is connected in the base-collector path of a transistor Q16. A resistor R12 is inserted between the collector of the transistor Q16 and a Vcc potential. A capacitor C21 is inserted in the base-collector path of a transistor Q26. A resistor R22 is inserted between the collector of the transistor Q26 and the Vcc potential. A reference potential Vref is applied to the bases of the transistors Q11, Q15 and Q25, respectively. With these exceptions, the differential amplifier of FIG. 7 is substantially the same as that of FIG. 4.

The collectors of transistors Q14 and Q24 which constitute first and third output terminals 5 and 11 are connected to the collectors of diode-connected transistors Q31 and Q32, respectively. The emitters of the transistors Q31 and Q32 are connected to each other, and are grounded through a resistor R32.

A second differential amplifier 23 comprises a pair of emitter-coupled transistors Q33 and Q34 for differential amplification, a variable current source 24 connected between the emitters of the transistors Q33 and Q34 and ground potential GND, a pair of emitter-coupled transistors Q38 and Q39 for differential amplification, a constant current source 25 connected between the emitters of the transistors Q38 and Q39 and ground potential GND, a current mirror circuit 26 having a reference input side transistor Q37 and two output side transistors Q35 and Q36, a resistor R33 connected between the collector of the transistor Q38 and the Vcc potential, a resistor R34 connected between the emitter of the transistor Q37 and the Vcc potential, and a capacitor C31 for oscillation prevention inserted in the collector-base path of the transistor Q38. The collectors of the transistors Q31 and Q32 of the first differential amplifier 20 are connected to the bases of the transistors Q33 and Q34, respectively. The base of the transistor Q38 is connected to the collector of the transistor Q34. The reference voltage Vref is applied to the base of the transistor Q39. The transistors Q35, Q36 and Q37 of the circuit 26 are connected to the collectors of the transistors Q33, Q34 and Q39, respectively. An input/output terminal 27 is connected to the collector of the transistor Q33.

In the second differential amplifier 23, the transistors Q33 and Q34 which have the circuit 26 as a load, perform differential amplification. The transistors Q38 and Q39 constitute a voltage follower circuit which is subjected to a negative feedback by the transistor Q36, so that the base potential of the transistor Q38 becomes equal to Vref. In this case, the base currents of the transistors Q35, Q36 and Q37 of the circuit 26 flow as part of the collector current to the transistor Q39, so that the collector currents of the transistors Q38 and Q39 become equal to each other. As a result, the current-mirror characteristics of the current mirror circuit 5 become satisfactory and no offset occurs in the output current. The collector-emitter voltages $V_{CE}$ of the transistors Q33 and Q34 become equal to each other and the collector-emitter voltages $V_{CE}$ of the transistors Q35 and Q36 become equal to each other. Therefore, even if the Vcc power source potential varies in a wide range, no offset occurs in the output current. Only transistors Q35 and Q36 are inserted as loads between the transistors Q33 and Q34 and the Vcc potential, respectively, and the collector-emitter voltages of the transistors Q35 and Q36 are small. Therefore, the variable resistor circuit 40 can be operated with a comparatively low voltage power source.

Impedance of the variable resistor circuit of FIG. 7 will now be calculated. A signal voltage $v_x$ is applied to the terminal 27. Assuming that a signal current flowing to the terminal 27 is represented by $i_x$, resistance Rx of the terminal 27 is generally given by:

$$Rx = \delta v_x / \delta i_x = Gx^{-1} \qquad (1)$$

where Gx is the mutual conductance.

Meanwhile, a mutual conductance $g_m'$ of a transistor having a resistance of $R_E$ in an emitter thereof is given by:

$$g_m' = g_m/(1 + g_m R_E) \qquad (2)$$

where $g_m$ is the mutual conductance of a transistor having a resistance $R_E$ in an emitter thereof. Therefore, AC voltage signals $v_x'$ and $v_x$ corresponding to $g_m'$ and $g_m$ hold the following relation:

$$v_x'/v_x = g_m'/g_m = \{g_m/(1 + g_m R_E)\}/g_m \qquad (3)$$
$$= 1/(1 + g_m R_E) = r_e/(R_E + r_e)$$

where $r_e$ is the emitter resistance of the transistor. Therefore, in the circuit of FIG. 7, $v_x'$ is given by:

$$v_x' = 2r_e/(R31 + 2r_e) \qquad (4)$$

with respect to $v_x$ applied to the base of the transistor Q21. Regarding $r_e$ of equation (4), assuming that the transistors Q11 and Q21 have the same characteristics, their emitter resistances $r_eQ11$ and $r_eQ21$ are equal to each other and $r_eQ11 = r_eQ21 = r_e$. Thus, $r_e$ is given by:

$$r_e = V_T/Io \qquad (5)$$

where $V_T$ is the thermal voltage. Therefore, substitution of equation (5) in equation (4) yields:

$$v_x' = 2V_T/(IoR31 + 2V_T) \cdot v_x \qquad (6)$$

Collector currents iQ11 and iQ21 including the signal currents of the transistors Q11 and Q21 are given by:

$$iQ11 = 2Io/\{1 + \exp(-v_x'/V_T)\} = 2Io/\{1 + \exp(-av_x)\} \qquad (7)$$

$$iQ21 = 2Io/\{1 + \exp(v_x'/V_T)\} = 2Io/\{1 + \exp(av_x)\} \qquad (8)$$

$$a = 2/(IoR31 + 2V_T) \qquad (9)$$

Referring to the circuit of FIG. 7, the following equations are established:

$$iQ11 = iQ14 = iQ31 \qquad (10)$$

$$iQ21 = iQ24 = iQ32 \qquad (11)$$

$$iQ33 = (Iv/2Io)iQ31 \qquad (12)$$

$$iQ34 = (Iv/2Io)iQ32 \qquad (13)$$

$$iQ36 = iQ35 = iQ34 \qquad (14)$$

$$\begin{aligned} i_x &= iQ33 - iQ35 = iQ33 - iQ34 \\ &= (Iv/2Io)iQ31 - (Iv/2Io)iQ32 \\ &= (Iv/2Io)(iQ11 - iQ21) \\ &= (Iv/2Io)[2Io/\{1 + \exp(-av_x)\} - \\ &\qquad\qquad 2Io/\{1 + \exp(av_x)\}] \\ &= Iv \cdot [1/\{1 + \exp(-av_x)\} - 1/\{1 + \exp(av_x)\}] \end{aligned} \qquad (15)$$

Substitution of equation (15) in equation (1) yields:

$$Gx = \delta i_x/\delta v_x = Iv\{ae^{-av_x}/(1+e^{-av_x})^2 + ae^{av_x}/(1+e^{av_x})^2\} \qquad (16)$$

Gx when the signal is small (represented as Gxo) is given by:

$$Gxo = aIv/2 = Iv/(R31Io + 2V_T) \qquad (17)$$

where $v_x \approx 0$ in equation (16). Then, Rx when the signal is small (represented as Rxo) is given by:

$$Rxo = Gxo^{-1} = (R31Io + 2V_T)/Iv \qquad (18)$$

From equation (18), it is understood that resistance Rxo of the terminal 27 is proportional to the value of current Iv of the variable current source 24. Thus, the resistance of the terminal 27 can be changed by changing the current Iv in accordance with the control input. It must be noted that the linear region of the variable characteristics is widened when $R31Io > 2V_T$ in equation (18).

Figure 8:
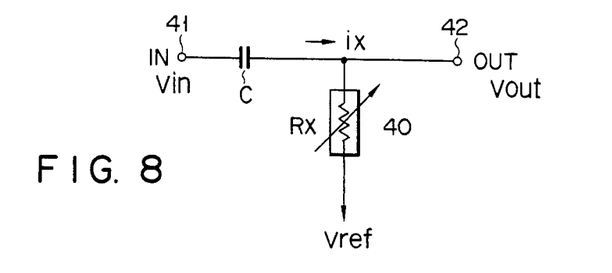
FIG. 8 is a circuit diagram of a variable filter circuit according to another application example of the present invention.

FIG. 8 shows a variable filter circuit using the circuit 40 of FIG. 7. The terminal 27 of FIG. 7 is divided into input and output terminals 41 and 42 and a capacitance C is inserted in an input path of FIG. 8. In the variable filter circuit of FIG. 8, an input signal voltage vin of the terminal 41 and an output signal voltage vout of the terminal 42 hold the following relation:

$$\begin{aligned} v_{out} &= \{Rx/(Rx + 1/j\omega c)\}v_{in} \\ &= \{j\omega cRx/(1 + j\omega cRx)\}v_{in} \end{aligned} \qquad (19)$$

A transfer function $G_0(\omega)$ is given by:

$$\left. \begin{aligned} G_0(\omega) &= j\omega cRx/(1 + j\omega cRx) = G1(\omega)\,G2(\omega) \\ G1(\omega) &= 1/(1 + j\omega cRx) \\ G2(\omega) &= j\omega cRx \end{aligned} \right\} \qquad (20)$$

and $$\omega c = 1/CRx \qquad (21)$$

Figure 9:
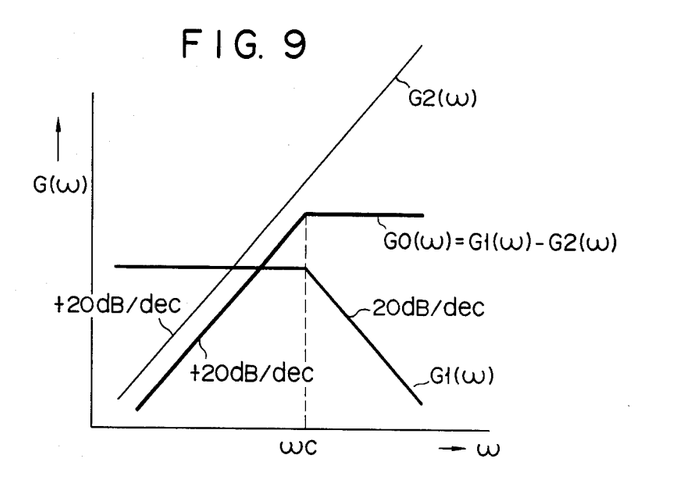
FIG. 9 shows characteristic curves of turnover frequency $\omega$ vs. transfer function $G(\omega)$ of the variable filter circuit shown in FIG. 8.

Equations (20) and (21) are represented as graphs in FIG. 9. As can be seen from FIG. 9, the variable filter circuit of FIG. 8 operates as a bypass filter and a turnover frequency ωc of the filter is varied by varying the resistance Rx of the circuit 40 (for example, ωc is decreased as Rx is increased).

Figure 10:
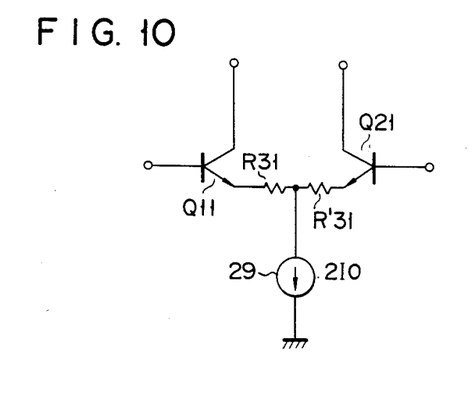
FIG. 10 shows a modification of a differential amplifying circuit section in the variable resistor circuit of FIG. 7.

The circuit 28 of the variable resistor circuit of FIG. 7 which is constituted by the differential pair of transistors Q11 and Q21, the emitter resistor R31 and the sources 21 and 22 can be replaced by a circuit of FIG. 10 to provide substantially the same operation. In the circuit in FIG. 10, two emitter resistors R31 and R'31 are provided and a single constant current source 29 for a constant current 2Io is connected to a common connecting point of the resistors R31 and R'31. However, when a particularly low power source voltage (e.g., VCCMIN=0.9 V) operation is required, if voltage drops across two ends of the resistors R31 and R'31 are large, they are merely losses of power. Thus, in this case, a circuit having a configuration as shown in FIG. 7 is preferable.

In the embodiments of FIGS. 4 to 6, emitter resistors can be connected to the transistors Q11 and Q21 for differential amplification. Also, resistors can be used instead of the constant current source 2, 9 and 14, respectively. In addition, the polarities of the transistors can be reversed, i.e., the npn transistors can be changed to pnp transistors and the pnp transistors to npn transistors. In this case, note that a Vcc potential must be changed to ground potential and ground potential must be changed to a Vcc potential throughout the description of the specification.

As is apparent from the above description, a differential amplifier according to the present invention can be operated at a low voltage power source and generate an output current which is not offset even if a power source voltage used varies in a wide range.

What is claimed is:

1. A differential amplifier comprising:
a pair of first and second input terminals receiving a pair of signal voltages to be amplified, respectively;
a first amplifying circuit comprising first and second transistors of a first conductivity type, the bases of which are connected to said first and second input terminals, respectively;
a second amplifying circuit comprising third and fourth transistors of said first conductivity type, said third transistor being at the non-inverting input side of said second amplifying circuit and said fourth transistor being at the inverting input side of said second amplifying circuit, the base of said fourth transistor being connected to the collector of said first transistor in said first amplifying circuit, and the base of said third transistor being connected to a first bias potential;
a first current mirror circuit comprising fifth and sixth transistors of a second conductivity type, the collector of said fifth transistor being connected to the base of said fourth transistor and the collector of said first transistor, and a collector current of said sixth transistor being taken out through a first output terminal as a first output current;
a third amplifying circuit comprising seventh and eighth transistors of said first conductivity type, said seventh transistor being at the non-inverting input side of said third amplifying circuit and said eighth transistor being at the inverting input side of said third amplifying circuit, the base of said eighth transistor being connected to the collector of said second transistor in said first amplifying circuit, and the base of said seventh transistor being connected to a second bias potential; and
a second current mirror circuit comprising ninth and tenth transistors of second conductivity type, the collector of said ninth transistor being connected to the base of said eighth transistor and the collector of said second transistor, and a collector current of said tenth transistor being taken out through a second output terminal as a second output current.

2. A differential amplifier according to claim 1, further comprising;
an eleventh diode connected transistor inserted between the collector of said third transistor of said second amplifying circuit and a predetermined potential, said predetermined potential being connected to the collector of said fourth transistor of said second amplifying circuit; and
a twelfth diode connected transistor inserted between the collector of said seventh transistor of said third amplifying circuit and said predetermined potential, said predetermined potential being connected to the collector of said eighth transistor of said third amplifying circuit.

3. A differential amplifier according to claim 1, further comprising:
a third current mirror circuit comprising eleventh and twelfth transistors of said second conductivity type, the collector of said eleventh transistor being connected to the base thereof and the collector of said fourth transistor of said second amplifying circuit and the collector of said twelfth transistor being connected to the collector of said third transistor of said second amplifying circuit; and
a fourth current mirror circuit comprising thirteenth and fourteenth transistors of said second conductivity type, the collector of said thirteenth transistor being connected to the base thereof and the collector of said eighth transistor of said third amplifying circuit and the collector of said fourteenth transistor being connected to the collector of said seventh transistor of said second amplifying circuit.

4. A differential amplifier according to claim 1, further comprising:
a thrid current mirror circuit comprising eleventh and twelfth transistors of said first conductivity type, the collector of said eleventh transistor being connected to the collector of said sixth transistor of said second amplifying circuit, and the collector of said twelfth transistor being connected to the collector of said tenth transistor of said third amplifying circuit.

* * * * *